United States Patent [19]
Groussin

[11] Patent Number: 5,365,533
[45] Date of Patent: Nov. 15, 1994

[54] INTEGRATED CIRCUIT OF SEMICONDUCTOR LASERS

[75] Inventor: Bernard Groussin, Les Ulis, France

[73] Assignee: Thomson Hybrides, Puteaux, France

[21] Appl. No.: 973,823

[22] Filed: Nov. 9, 1992

[30] Foreign Application Priority Data

Nov. 22, 1991 [FR] France .................. 91 14401

[51] Int. Cl.$^5$ .............................. H01S 3/045
[52] U.S. Cl. ...................... 372/36; 257/745; 372/50
[58] Field of Search ............ 372/50, 36; 257/745

[56] References Cited

U.S. PATENT DOCUMENTS

| | | | |
|---|---|---|---|
| 4,757,369 | 7/1988 | Jackson et al. | 257/745 |
| 4,881,237 | 11/1989 | Donnelly | 372/50 |
| 4,956,683 | 9/1990 | Quintana | 357/17 |
| 5,012,477 | 4/1991 | Mesquida et al. | 372/50 |
| 5,031,187 | 7/1991 | Orenstein et al. | 372/50 |

FOREIGN PATENT DOCUMENTS

| | | | |
|---|---|---|---|
| 0061220 | 9/1982 | European Pat. Off. | |
| 0369856 | 5/1990 | European Pat. Off. | |
| 62-291060 | 12/1987 | Japan | 257/745 |
| 63-52473 | 3/1988 | Japan | 257/745 |

Primary Examiner—James W. Davie
Attorney, Agent, or Firm—Oblon, Spivak, McClelland, Maier & Neustadt

[57] ABSTRACT

The disclosure relates to integrated circuits of lasers, wherein the linear arrays are supplied in series, with a return of current through the substrate. When the substrate is semi-insulating, only the first epitaxially grown layer is conductive. To reduce its electrical resistance, a surface film of the substrate is made conductive by diffusion of a dopant. Application to power semiconductor lasers.

7 Claims, 2 Drawing Sheets

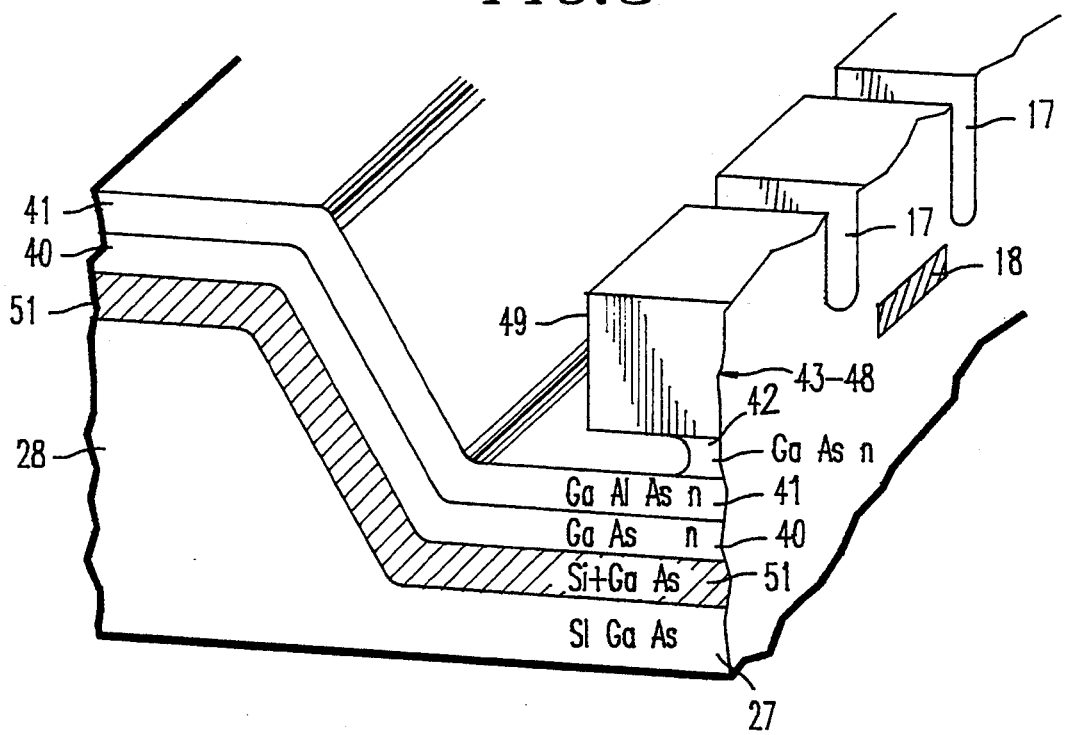

INTEGRATED CIRCUIT OF SEMICONDUCTOR LASERS

BACKGROUND OF THE INVENTION

The present invention relates to an integrated circuit comprising at least one linear array of laser diodes, the substrate of which is modified in order to improve the current supply of the semiconductor lasers. The invention also relates to a method for modifying the substrate of this integrated circuit of lasers.

The supply of current to semiconductor lasers, whether these are taken separately or in a group on a linear array containing up to about thirty of them, does not entail any particular problems because the current can flow through the doped, hence conductive, substrate. In this case, the electrical supply is applied to both the upper face and the lower face of the laser or of the linear array.

This is not so with integrated circuits of lasers in which the substrate supports a plurality of linear arrays of lasers alternated with a plurality of bands or surfaces of reflectors. An integrated circuit such as this is described in the French patent application No. 88 14799 dated 15th Nov. 1988 which is the priority document for U.S. Pat. No. 5,012,477. In these integrated circuits, the lasers of a same linear array are supplied in parallel, but the arrays are supplied in series, by metallizations that run along the surface of the semiconductor layers. This type of parallel/series supply is preferable because it is easier to regulate an average current under an average voltage than a high current under low voltage: for example 15 A under 66 V rather than 500 A under 2 V. Consequently, the substrate of the integrated circuit is preferably semi-insulating, otherwise it would short-circuit the linear arrays in series.

The current is applied to the linear arrays of lasers by a first metallization, on the upper face, but the circuit is looped by a conductive layer, for example made of n type GaAs, epitaxially grown on the semi-insulator substrate, electrically linked to a second metallization. To let through the necessary current, this conductive layer should be thick. However, it is epitaxially grown and its thickness cannot exceed about 5 microns. Indeed, the structure of the different layers that are epitaxially grown on the substrate to make an integrated circuit of lasers reaches a thickness of 13 microns, which is considerable. Epitaxial growth on a greater thickness would result in lowering the crystallographic quality.

Furthermore, this conductive layer made of n type GaAs, doped at $2.10^{18}$ a/cm$^3$ and having a thickness of 5 microns, has electrical resistance of the order of 4 ohms: it is desirable to be able to reduce its resistance.

The invention provides a solution to these problems and can be used to obtain a thick conductive layer with low electrical resistance on a semi-insulator substrate, without lowering the crystallographic quality of the structure. This is obtained by a thermal diffusion or an implantation designed to dope the substrate on the surface to make it conductive on a given thickness without causing deterioration in its monocrystal crystallography. After this modification of the substrate, the constituent layers of the lasers are epitaxiated, normally, within limits of thicknesses that do not lower the quality of the crystallography.

SUMMARY OF THE INVENTION

More specifically, the invention relates to an integrated circuit of semiconductor lasers, comprising at least one linear array of lasers formed by a plurality of layers epitaxially grown on a semi-insulator substrate, these lasers being supplied with current vertically between a first metal contact deposited on said linear array and a second metal contact made on the first conductive layer epitaxially grown on the substrate, this integrated circuit being one wherein, in order to lower the resistance of the first epitaxially grown layer, a surface layer of the substrate in contact with said first layer is made conductive by diffusion of dopant.

BRIEF DESCRIPTION OF THE DRAWING

The invention shall be understood more clearly from the following description of an exemplary application, based on the appended figures, of which:

FIG. 2 is a diagram showing the structure of the layers of semiconductor materials of an elementary laser according to the invention;

FIG. 3 is a partial view of an integrated circuit according to the invention, enlarged so as to show its details.

DETAILED DESCRIPTION OF THE INVENTION

Figure 1:
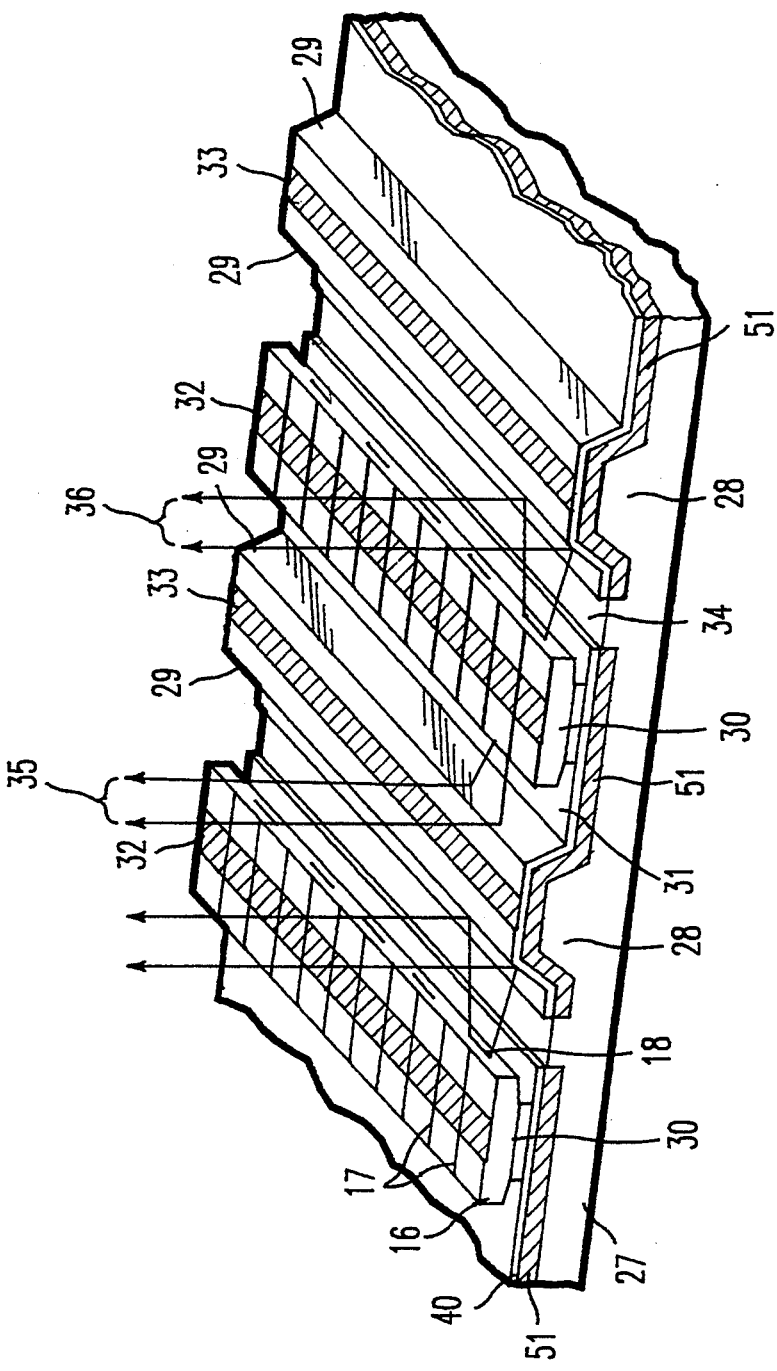
FIG. 1 shows an isometric projection of an integrated circuit of lasers according to the invention.

FIG. 1 shows a three-quarter view of an integrated laser circuit described in the above-mentioned patent application, but modified according to the invention. However, in order to facilitate the comparison, the indices of the references used for the patent application No. 88 14799 (U.S. Pat. No. 5,012,477) are kept.

An integrated circuit according to the invention comprises a substrate 27 made of materials of the III-V group. To simplify the explanation, it shall be assumed that the substrate is made of semi-insulating GaAs. Reflectors 28 are cut into this substrate 27. These reflectors 28 take the form of mutually parallel bands, having a trapezoidal section with sides inclined at 45°, or a semi-circular section. At least the flanks 29 of these bands are metallized, to make them into plane mirrors inclined at 45° or semi-cylindrical mirrors and, at the same time, to conduct current.

Linear arrays 30 of semiconductor lasers are positioned between the reflecting bands. Each linear array comprises the following formed by a sequence of epitaxial steps: a plurality of layers of semiconductor materials, referenced 16 and shown in detail in FIG. 2. A plurality of grooves 17 is etched in these layers. These grooves are parallel to one another but perpendicular to the longitudinal axis of each linear array 30. Taken two by two, these grooves 17 define the emitter strips 18 of each elementary laser.

Of the series of epitaxially grown layers 16, at least the first deposited layer 40, which is doped and hence conductive, covers the semi-insulator substrate 27 on its free surface 31 and on the flanks 29 of the bands 28 of reflectors.

A metallization 32 runs along the free, upper face of each linear array of lasers 30, and a metallization 33 runs along on the upper face of each band 28 of reflectors: these two metallizations 32 and 33 make it possible, in connection with the epitaxially grown conductive layer 40, to supply the elementary lasers with current.

When the integrated circuit is powered, each elementary laser, through its strip 18, emits a beam of coherent light 35 by a cleaved face and a beam 36 by the other cleaved face. These two beams are reflected substantially perpendicularly to the general plane of the integrated circuit by the metallized flanks 29 of the bands 28 of reflectors. The entire integrated circuit therefore emits a plurality of beams 35-36 that are mutually parallel and perpendicular to the plane of the substrate.

The electrical supply of a laser is done in all three dimensions of space from the metallization 32, through the conductive layers 48 to 42, with a return to the metallization 33 by means of the layers 41 and 40 on the flanks 29 of the reflectors. If the linear arrays of an integrated circuit are not to be mutually short-circuited by the conductive layer 40+41, when they are supplied in series, an etching 34 or a comparable insulating zone is made either on the free surface 31 or on a linear array 28 of reflectors, so as to break the electrical continuity on the surface of the integrated circuit.

It is seen that the current which flows vertically through a linear array 30 of lasers is looped by one or two layers of conductive materials.

Now these two layers cannot be very thick because they are epitaxially grown. FIG. 2 gives the detail of the layers needed for an integrated circuit of lasers.

The following are superimposed on the semi-insulator substrate:

- a conductive layer 40, with a thickness of 2 $\mu$m to 5 $\mu$m, made of GaAs;
- a layer 41 of GaAlAs which is a barrier layer to stop the chemical etching of a overhanging feature 50 in a GaAs layer 42, needed for the cleaved faces of the lasers,
- a plurality of layers 43 to 47, all made of GaAlAs, which define a quantum well 45,
- a layer 48 for the making of a GaAs electrical contact.

All these layers attain a thickness of about 13 micrometers, and it is not possible to considerably increase the thickness of the layer 40 to reduce the electrical resistance thereof, owing to the excessively great risk of destruction of the crystallographic balance.

In the solution proposed by the invention, without any modification of the necessary epitaxially grown structure, a part of the semi-insulator substrate 27 is made conductive by means of a diffusion of silicon Si in a surface layer 51 of the substrate, and naturally on the side of the substrate that supports the epitaxially grown layers. The implanting of silicon is a possible approach but it damages the crystal lattice of the substrate while a diffusion does not destroy it, and enables the subsequent setting up of an epitaxially grown structure as described here above.

FIG. 3 shows an enlargement of the region common to the linear arrays of lasers and to the bands of reflectors, wherein the epitaxially grown layers 40 to 48 are set up on the diffused layer 51.

The product diffused in the substrate may be different from silicon: this product has been referred to because it is the one most commonly used to provide GaAs with n type doping. Any dopant, preferably of the n type, for doping a substrate used in optoelectronics meets the criterion of the invention.

The layer 51, which is doped by diffusion, has a thickness of several microns, typically 2 $\mu$m to 5 $\mu$m. Just like the epitaxially grown conductive layer 40, this diffused layer 51 is interrupted just above the etchings 34 to prevent the short-circuiting of the linear arrays 30 of lasers if these arrays are supplied serially. This layer is made by the method that is now described.

The first step of a method of batch manufacture consists in the etching, by chemical solution, of the semi-insulator substrate wafers, made of GaAs for example, to form the bands 28 of reflectors. The technique used is known, and is described in the patent referred to.

Then, a film of silicon with a thickness of 0.05 to 0.1 micron is deposited on the substrate, by evaporation or cathode sputtering, and this silicon film is encapsulated in an impervious film of silica or silicon nitride, deposited by CVD plasma, with a thickness of about 0.1 micron. The encapsulation is necessary to enable the heating of a GaAs wafer without evaporating the arsenic.

The thermal diffusion of silicon on GaAs is done in a sealed bulb for ten hours at a temperature ranging from 650° to 1000° C.

After the diffusion, the envelope of silica or nitride is removed by chemical etching or plasma RIE, and the surface of the substrate wafer is regenerated and cleaned, by a chemical etching process which strips it on about 0.1 micron.

On this semi-insulating substrate which is made conductive on the surface by the diffused layer 51, the epitaxy operations described in the patent referred to are undertaken for the efficient manufacture of the linear arrays 30 of lasers and bands of reflectors 28-29.

This method of modifying a substrate is used to make integrated circuits of lasers emitting very great optical power.

What is claimed is:

1. An integrated circuit of semiconductor lasers, comprising:
   at least one linear array of lasers formed by a plurality of layers epitaxially grown on a semi-insulator substrate, said lasers being supplied with current between a first metal contact deposited on said linear array and a second metal contact on a first of said plurality of epitaxially grown conductive layers;
   wherein, in order to lower the resistance of the first epitaxially grown conductive layer, a surface layer of the substrate in contact with said first epitaxially grown conductive layer has a dopant diffused therein to make said surface layer conductive.

2. An integrated circuit according to claim 1, wherein the substrate is semi-insulating gallium arsenide, and the dopant diffused in the surface layer is silicon.

3. An integrated circuit according to claim 1 wherein:
   said at least one linear array of lasers includes at least two linear arrays of lasers which are supplied with current in series, both the first epitaxially grown layer and the diffused surface layer are interrupted by an etching located between the at least two linear arrays.

4. An integrated circuit according to claim 1, wherein said lasers emit light in a horizontal direction which is reflected off of an angular surface to produce light in a vertical direction.

5. An integrated circuit according to claim 4, wherein both said first epitaxially grown conductive layer and said surface layer of the substrate extend from under said lasers, under said angular surface, to said second metal contact which is disposed on a top portion of a bulge which has at least one side thereof defined by said angular surface.

6. An integrated circuit according to claim 5, wherein said first metal contact is disposed on an upper portion of said lasers and said first epitaxially grown conductive layer is disposed on a lower portion of said lasers.

7. An integrated circuit according to claim 1, wherein said first metal contact is disposed on an upper portion of said lasers and said first epitaxially grown conductive layer is disposed on a lower portion of said lasers.

* * * * *